United States Patent
Hayashi et al.

(10) Patent No.: US 12,404,209 B2
(45) Date of Patent: Sep. 2, 2025

(54) LAMINATE

(71) Applicant: Nippon Electric Glass Co., Ltd., Shiga (JP)

(72) Inventors: Masahiro Hayashi, Shiga (JP); Kosuke Kawamoto, Shiga (JP)

(73) Assignee: NIPPON ELECTRIC GLASS CO., LTD., Shiga (JP)

( * ) Notice: Subject to any disclaimer, the term of this patent is extended or adjusted under 35 U.S.C. 154(b) by 312 days.

(21) Appl. No.: 18/024,314

(22) PCT Filed: Aug. 19, 2021

(86) PCT No.: PCT/JP2021/030411
§ 371 (c)(1),
(2) Date: Mar. 2, 2023

(87) PCT Pub. No.: WO2022/054527
PCT Pub. Date: Mar. 17, 2022

(65) Prior Publication Data
US 2023/0265011 A1    Aug. 24, 2023

(30) Foreign Application Priority Data

Sep. 8, 2020  (JP) ................................. 2020-150210
Dec. 14, 2020  (JP) ................................. 2020-206788

(51) Int. Cl.
C03C 25/007 (2018.01)
C03C 3/083 (2006.01)
C03C 3/091 (2006.01)
C03C 25/46 (2006.01)

(52) U.S. Cl.
CPC ............ *C03C 25/007* (2013.01); *C03C 3/083* (2013.01); *C03C 3/091* (2013.01); *C03C 25/46* (2013.01); *C03C 2201/40* (2013.01); *C03C 2203/50* (2013.01); *C03C 2217/25* (2013.01)

(58) Field of Classification Search
None
See application file for complete search history.

(56) References Cited

U.S. PATENT DOCUMENTS

| | | | |
|---|---|---|---|
| 2006/0243478 A1* | 11/2006 | Inagaki | H01L 23/49827 257/E23.079 |
| 2015/0086048 A1 | 3/2015 | Brown et al. | |
| 2015/0129293 A1* | 5/2015 | Cho | H01L 24/97 174/258 |
| 2019/0210911 A1 | 7/2019 | Ono et al. | |
| 2021/0023820 A1 | 1/2021 | Yamabe et al. | |
| 2022/0024805 A1* | 1/2022 | Matsuo | C03C 4/14 |

FOREIGN PATENT DOCUMENTS

| | | |
|---|---|---|
| JP | 52-121685 | 10/1977 |
| JP | 2015-123592 | 7/2015 |
| JP | 2016-8161 | 1/2016 |
| JP | 2020-90021 | 6/2020 |
| WO | 2018/051793 | 3/2018 |
| WO | 2020/004384 | 1/2020 |

OTHER PUBLICATIONS

International Search Report (ISR) issued Oct. 19, 2021 in International (PCT) Application No. PCT/JP2021/030411.
English language translation of International Preliminary Report on Patentability issued Mar. 7, 2023 in International (PCT) Patent Application No. PCT/JP2021/030411.
Notice of Reasons for Refusal issued Jan. 22, 2025 in corresponding Japanese Patent Application No. 2020-206788, with machine English translation.

* cited by examiner

*Primary Examiner* — Ramsey Zacharia
(74) *Attorney, Agent, or Firm* — Wenderoth, Lind & Ponack, L.L.P.

(57) ABSTRACT

A laminate according to an embodiment of the present invention includes at least one glass sheet and at least one resin layer, a relative dielectric constant of the glass sheet at 25° C. and a frequency of 2.45 GHz being 5 or less, and a dielectric loss tangent of the glass sheet at 25° C. and a frequency of 2.45 GHz being 0.003 or less.

10 Claims, No Drawings

LAMINATE

TECHNICAL FIELD

The present invention relates to a laminate, and specifically relates to a laminate suitable for multi-layer circuit boards for high-frequency communication.

BACKGROUND ART

Currently, development is underway to support the fifth generation mobile communication system (5G), and technical studies are being conducted to increase the speed of the system, increase transmission capacity, and reduce latency. Multi-layer circuit boards used in this application are also required to have reduced transmission loss in high-frequency communication.

SUMMARY OF INVENTION

Technical Problem

In recent years, as electronic devices have become more sophisticated, circuits in multi-layer circuit boards are becoming finer. In order to accommodate this, it becomes necessary for multi-layer circuit boards to have a core layer with good surface flatness and excellent dimensional stability. However, currently, resin layers obtained by impregnating a glass cloth with a resin does not have sufficient surface smoothness and dimensional stability.

The present invention has been made in view of the above circumstances, and the technical problem of the present invention is how to provide a laminate that has a low dielectric property and is conducive to high density circuits.

Solution to Problem

As a result of repeating various experiments, the inventors of the present invention found that the above technical problem can be solved by laminating a glass sheet having low dielectric properties and a resin layer, and proposed the finding as the present invention. That is, the laminate according to an embodiment the present invention includes at least one glass sheet and at least one resin layer, a relative dielectric constant of the glass sheet at 25° C. and a frequency of 2.45 GHz being 5 or less, and a dielectric loss tangent of the glass sheet at 25° C. and a frequency of 2.45 GHz being 0.003 or less. This makes it possible to reduce transmission loss when an electric signal is transmitted to a high-frequency device. Here, the "relative dielectric constant at 25° C. and a frequency of 2.45 GHz" can be measured, for example, by a well-known cavity resonator method. The "dielectric loss tangent at 25° C. and a frequency of 2.45 GHz" can be measured, for example, by a well-known cavity resonator method.

The laminate according to an embodiment of the present invention includes at least one glass sheet. Glass sheets are suitable as a core layer of multi-layer circuit boards. The laminate including a glass sheet has the following effects. The thermal expansion coefficient of glass sheets is lower than that of resins, which leads to a smaller difference between the thermal expansion coefficient of glass sheets and the thermal expansion coefficient of silicon, a material of semiconductor chips. As such, the stress on a connection portion when mounting a chip becomes smaller, and connection reliability can be increased. In addition, glass sheets have a better flatness than that of resins, which is advantageous for the formation of fine circuits. Furthermore, glass sheets have excellent dimensional stability since, compared to resins, glass sheets have less expansion and contraction due to heat or moisture absorption. As such, positional deviation of patterns during photolithography or via formation is reduced, which is advantageous for the formation of fine circuits.

The laminate according to an embodiment of the present invention includes at least one glass sheet and at least one resin layer. This allows the glass sheet to serve as a core layer with the resin layer further laminated, making high density circuits in multi-layer circuit boards possible.

In the laminate according to an embodiment of the present invention, a relative dielectric constant of the glass sheet at 25° C. and a frequency of 2.45 GHz is 5 or less, and a dielectric loss tangent of the glass sheet at 25° C. and a frequency of 2.45 GHz is 0.003 or less. This makes it possible to reduce transmission loss in high-frequency communication.

Furthermore, in the laminate according to an embodiment of the present invention, the resin layer is preferably a pre-preg in which a glass cloth is impregnated with a resin.

Furthermore, in the laminate according to an embodiment of the present invention, a metal layer is preferably formed on a surface of the glass sheet and/or inside the glass sheet.

Furthermore, in the laminate according to an embodiment of the present invention, the metal layer preferably contains one or more of copper, silver, gold, aluminum, molybdenum, tungsten, nickel, tin, and an alloy of these metals.

Furthermore, in the laminate according to an embodiment of the present invention, the glass sheet preferably has a thickness from 5 to 50 μm. In order to reduce the dielectric loss of the laminate, it is necessary to reduce the relative dielectric constant or the dielectric loss tangent of the laminate. Also, the propagation speed of electrical signal is calculated based on the equation $V=C/\sqrt{\varepsilon}$, but the relative dielectric constant changes depending on, for example, signal line width or thickness of insulation of the laminate. As such, when the thickness of the glass sheet is reduced, the distance between the ground and signal lines is reduced, and the effective relative dielectric constant can be lowered. As a result, the propagation speed of electrical signal can be increased. Further, it becomes easier to form a through hole in the glass sheet, making high density circuits in multi-layer circuit boards possible.

Furthermore, in the laminate according to an embodiment of the present invention, the glass sheet preferably includes from 60 to 90 mol % of $SiO_2$, from 1 to 15 mol % of $Al_2O_3$, from 5 to 30 mol % of $B_2O_3$, from 0 to 8 mol % of MgO+CaO+SrO+BaO, from 0 to 8 mol % of MgO, and from 0 to 8 mol % of CaO in a glass composition. "MgO+CaO+SrO+BaO" refers to a total amount of MgO, CaO, SrO, and BaO.

Furthermore, in the laminate according to an embodiment of the present invention, a through hole is preferably formed in the glass sheet in a thickness direction. This makes it possible to form a circuit structure for establishing conduction between both surfaces of the glass sheet, making it easy to apply the laminate to a high-frequency device.

Furthermore, in the laminate according to an embodiment of the present invention, the through hole formed in the glass sheet preferably has an inner diameter of 200 μm or less. This makes it easy to increase the density of the circuit structure for establishing conduction between both surfaces of the glass sheet.

Furthermore, in the laminate according to an embodiment of the present invention, a difference between a maximum value and a minimum value of the inner diameter of the through hole formed in the glass sheet is preferably 100 μm or less. This can prevent a circuit for establishing conduction between both surfaces of the glass sheet from becoming unreasonably long, and thus the transmission loss can be reduced.

Furthermore, in the laminate according to an embodiment of the present invention, a metal layer is preferably formed on an inner circumferential surface of the through hole formed in the glass sheet.

Furthermore, the laminate according to an embodiment of the present invention is preferably used in a multi-layer circuit board.

DESCRIPTION OF EMBODIMENTS

The laminate according to an embodiment of the present invention includes at least one glass sheet and at least one resin layer. This allows the glass sheet to serve as a core layer with the resin layer further laminated, making high density circuits in multi-layer circuit boards possible. Glass sheets are suitable as a core layer of multi-layer circuit boards. The laminate including a glass sheet has the following effects. The thermal expansion coefficient of glass sheets is lower than that of resins, which leads to a smaller difference between the thermal expansion coefficient of glass sheets and the thermal expansion coefficient of silicon, a material of semiconductor chips. As such, the stress on a connection portion when mounting a chip becomes smaller, and connection reliability can be increased. In addition, glass sheets have a better flatness than that of resins, which is advantageous for the formation of fine circuits. Furthermore, glass sheets have excellent dimensional stability since, compared to resins, glass sheets have less expansion and contraction due to heat or moisture absorption. As such, positional deviation of patterns during photolithography or via formation is reduced, which is advantageous for the formation of fine circuits.

A number of the glass sheets is one or more, preferably two or more, particularly preferably from 3 to 20 layers. A number of the resin layers is one or more, preferably 3 or more, and particularly preferably from 5 to 30 layers. A larger number of layers allows achievement of high density circuits in multi-layer circuit boards.

In the laminate according to an embodiment of the present invention, a metal layer is preferably formed on a surface of the glass sheet and/or inside the glass sheet. The metal layer can be used as a wiring. Taking into consideration a low level of resistivity, cost, and availability, the metal layer preferably contains one or more of copper, silver, gold, aluminum, molybdenum, tungsten, nickel, tin, and an alloy of these metals, and particularly preferably contains copper or a copper-containing alloy.

In the laminate according to an embodiment of the present invention, the glass sheet preferably includes from 60 to 90 mol % of $SiO_2$, from 1 to 15 mol % of $Al_2O_3$, from 5 to 30 mol % of $B_2O_3$, from 0 to 8 mol % of MgO+CaO+SrO+BaO, from 0 to 8 mol % of MgO, and from 0 to 8 mol % of CaO in a glass composition. The reason for limiting the content of each component as described above is as follows. Note that, hereinafter, "%" means "mol %" unless otherwise specified.

A lower limit content of $SiO_2$ is preferably 60%, 61%, 62%, 63%, 64%, or 65%, and particularly preferably 66%, while an upper limit content of $SiO_2$ is preferably 90%, 85%, 80%, 75%, 73%, 71%, or 70%, and particularly preferably 69%. When the content of $SiO_2$ is too low, relative dielectric constant, dielectric loss tangent, and density tend to be large. Furthermore, moisture resistance tends to decrease. Meanwhile, when the content of $SiO_2$ is too high, viscosity in high temperature increases while meltability decreases, and devitrified crystals such as cristobalite tend to precipitate during forming.

$Al_2O_3$ is a component that increases the Young's modulus, and is a component that suppresses phase separation and significantly increases weather resistance. As such, a lower limit content of $Al_2O_3$ is preferably 1%, 2%, 2.5%, 3%, 3.5%, or 4%, and particularly preferably 4.5%. Meanwhile, when the content of $Al_2O_3$ is too high, a liquidus temperature increases, and devitrification resistance tends to decrease. As such, an upper limit content of $Al_2O_3$ is preferably 15%, 13%, 12%, 11%, 10%, 9%, or 8%, and particularly preferably 7%.

$B_2O_3$ is a component that reduces relative dielectric constant and dielectric loss tangent, and is a component that reduces the Young's modulus and density. $B_2O_3$ is also a component that reduces moisture resistance. However, when the content of $B_2O_3$ is too low, it becomes difficult to ensure a low dielectric property, and in addition, the function as a flux becomes insufficient. As such, viscosity in high temperature increases, and bubble-less quality tends to decrease. Furthermore, it becomes difficult to achieve a low density. As such, a lower limit content of $B_2O_3$ is preferably 5%, 10%, 15%, 18%, 20%, 21%, 22%, or 23%, and particularly preferably 24%. Meanwhile, when the content of $B_2O_3$ is too high, heat resistance and chemical durability tend to decrease, and moisture resistance tends to decrease due to phase separation. As such, an upper limit content of $B_2O_3$ is preferably 30%, 29%, 28%, or 27%, and particularly preferably 26%.

A content of $B_2O_3-_2O_3$ is preferably 14% or greater, 15% or greater, 16% or greater, 17% or greater, 18% or greater, 19% or greater, 20% or greater, 21% or greater, 22% or greater, or 23% or greater, and particularly preferably 24% or greater. When the content of $B_2O_3-Al_2O_3$ is too low, it becomes difficult to ensure a low dielectric property. Note that "$B_2O_3-Al_2O_3$" is obtained by subtracting the content of $Al_2O_3$ from the content of $B_2O_3$.

An alkaline earth metal oxide is a component that lowers the liquidus temperature and makes it difficult for devitrified crystals to be produced in glass, and is a component that increases meltability and formability. When the content of MgO+CaO+SrO+BaO is too low, devitrification resistance tends to decrease. In addition, the function as a flux cannot be sufficiently exhibited, and meltability tends to decrease. Meanwhile, when the content of MgO+CaO+SrO+BaO is too high, relative dielectric constant and dielectric loss tangent may increase, and density increases, making it difficult to reduce the weight of the glass. In addition, thermal expansion coefficient becomes unreasonably large, and thermal shock resistance tends to decrease. A lower limit content of MgO+CaO+SrO+BaO is preferably 0.1%, 0.5%, 1%, 1.5%, 2%, 2.1%, 2.2%, 2.3%, 2.4%, 2.5%, 2.6%, 2.7%, 2.8%, or 2.9%, and particularly preferably 3%, while an upper limit content of MgO+CaO+SrO+BaO is preferably 6%, 5.5%, 5%, 4.8%, 4.6%, 4.4%, or 4.2%, and particularly preferably 4%.

MgO is a component that reduces viscosity in high temperature and increases meltability without lowering a strain point. MgO is a component that is the least likely to cause increase in density among alkaline earth metal oxides. In addition, MgO is a component that increases moisture resistance especially among alkaline earth metal oxides. However, when the content of MgO is too high, the liquidus temperature increases, and devitrification resistance tends to decrease. In addition, the glass tends to undergo phase separation, and transparency tends to decrease. A lower limit content of MgO is preferably 0%, 0.5%, 0.6%, 0.7%, 0.8%, or 0.9%, and particularly preferably 1%, while an upper limit content of MgO is preferably 8%, 5%, 4%, 3%, or 2.5%, and particularly preferably 2%.

CaO is a component that reduces viscosity in high temperature and significantly increases meltability without lowering the strain point, and is a component that greatly increases devitrification resistance in a glass composition according to an embodiment of the present invention. In addition, among alkaline earth metal oxides, CaO is a component that increases moisture resistance. As such, a lower limit content of CaO is preferably 0%, 0.5%, 1%, 1.5%, or 2%, and particularly preferably 2.5%, while an upper limit content of CaO is 8%, 5%, 4.5%, 4%, or 3.5%, and particularly preferably 3%.

SrO is a component that reduces viscosity in high temperature and increases meltability without lowering the strain point. However, when the content of SrO is too high, the liquidus viscosity tends to decrease. As such, a content of SrO is preferably from 0 to 5%, from 0 to 4%, from 0 to 3%, from 0 to 2%, from 0 to 1.5%, from 0 to 1%, or from 0 to 0.5%, and particularly preferably from 0 to 0.1%.

BaO is a component that reduces viscosity in high temperature and increases meltability without lowering the strain point. However, when the content of BaO is too high, the liquidus viscosity tends to decrease. As such, a content of BaO is preferably from 0 to 5%, from 0 to 4%, from 0 to 3%, from 0 to 2%, from 0 to 1.5%, from 0 to 1%, or from 0 to 0.5%, and particularly preferably 0% or eater and less than 0.1%.

In addition to the components described above, the following components may be introduced into the glass composition.

An alkali metal oxide is a component that increases meltability and formability. However, when a content thereof is too high, for examples, density increases, water resistance decreases, thermal expansion coefficient becomes unreasonably large, thermal shock resistance decreases, or thermal expansion coefficient becomes difficult to match those of the surrounding materials. As such, a total amount of $Li_2O$, $Na_2O$, and $K_2O$, is from 0 to 3%, preferably from 0 to 2%, from 0 to 1%, from 0 to 0.5%, from 0 to 0.2%, or from 0 to 0.1%, and particularly preferably 0.001% or greater and less than 0.05%. A content of each of $Li_2O$, $Na_2O$, and $K_2O$ is preferably from 0 to 3%, from 0 to 2%, from 0 to 1%, from 0 to 0.5%, from 0 to 0.2%, or from 0 to 0.1%, and particularly preferably 0.001% or greater and less than 0.01%.

ZnO is a component that increases meltability. However, when ZnO is contained in a large amount in a glass composition, the glass tends to devitrify, and the density tends to increase. As such, a content of ZnO is preferably from 0 to 5%, from 0 to 3%, from 0 to 0.5%, or from 0 to 0.3%, and particularly preferably from 0 to 0.1%.

$ZrO_2$ is a component that increases the Young's modulus. A content of $ZrO_2$ is preferably from 0 to 5%, from 0 to 3%, from 0 to 0.5%, from 0 to 0.2%, from 0 to 0.16%, or from 0 to 0.1%, and particularly preferably from 0 to 0.02%. When the content of $ZrO_2$ is too high, the liquidus temperature increases, and devitrified crystals of zircon tend to precipitate.

$TiO_2$ is a component that reduces viscosity in high temperature and increases meltability, and is a component that suppresses solarization. However, when $TiO_2$ is contained in a large amount in a glass composition, glass coloring occurs, and transmittance tends to decrease. As such, a content of $TiO_2$ is preferably from 0 to 5%, from 0 to 3%, from 0 to 1%, or from 0 to 0.1%, and particularly preferably from 0 to 0.02%.

$P_2O_5$ is a component that increases devitrification resistance. However, when $P_2O_5$ is contained in a large amount in a glass composition, the glass tends to undergo phase separation and becomes milky, and water resistance may decrease significantly. As such, a content of $P_2O_5$ is preferably from 0 to 5%, from 0 to 1%, or from 0 to 0.5%, and particularly preferably from 0 to 0.1%.

$Fe_2O_3$ is a component that may be introduced as an impurity component or a fining agent component. However, when a content of $Fe_2O_3$ is too high, UV transmittance may decrease. As such, the content of $Fe_2O_3$ is preferably 0.05% or less, or 0.03% or less, and particularly preferably 0.02% or less. Here, "$Fe_2O_3$" in the present invention includes ferrous oxide and ferric oxide, and ferrous oxide is treated as $Fe_2O_3$ after conversion. Note that other oxides are treated in a similar manner using the indicated oxides as reference.

$SnO_2$ is a component that has a good fining action in a high temperature range, and is a component that reduces viscosity in high temperature. A content of $SnO_2$ is preferably from 0 to 1%, or from 0.01 to 0.5%, and particularly preferably from 0.05 to 0.2%. When the content of $SnO_2$ is too high, devitrified crystals of $SnO_2$ tend to precipitate in the glass.

$SnO_2$ is preferably added as a fining agent, but as long as the glass properties are not compromised, up to 1% of $CeO_2$, $SO_3$, C, or a metal powder (such as Al or Si) may be added as a fining agent.

$As_2O_3$, $Sb_2O_3$, F, or Cl also acts effectively as a fining agent, and the present invention does not exclude the inclusion of these components. However, from an environmental viewpoint, a content of each of these components is preferably less than 0.1%, and particularly preferably less than 0.05%.

The glass sheet according to an embodiment of the present invention preferably has the following properties.

A relative dielectric constant at 25° C. and a frequency of 28 GHz is preferably 5 or less, 4.9 or less, 4.8 or less, 4.7 or less, or 4.6 or less, and particularly preferably 4.5 or less. When the relative dielectric constant at 25° C. and a frequency of 28 GHz is too large, transmission loss when an electrical signal is transmitted to a high-frequency device tends to increase.

A dielectric loss tangent at 25° C. and a frequency of 28 GHz is preferably 0.01 or less, 0.009 or less, 0.008 or less, 0.007 or less, 0.006 or less, 0.005 or less, or 0.004 or less, and particularly preferably 0.003 or less. When the dielectric loss tangent at 25° C. and a frequency of 28 GHz is too large, transmission loss when an electrical signal is transmitted to a high-frequency device tends to increase.

A relative dielectric constant at 25° C. and a frequency of 2.45 GHz is preferably 5 or less, 4.9 or less, 4.8 or less, 4.7 or less, or 4.6 or less, and particularly preferably 4.5 or less. When the relative dielectric constant at 25° C. and a frequency of 2.45 GHz is too large, transmission loss when an electrical signal is transmitted to a high-frequency device tends to increase.

A dielectric loss tangent at 25° C. and a frequency of 2.45 GHz is preferably 0.003 or less, 0.002 or less, 0.001 or less, 0.0009 or less, or 0.0008 or less, and particularly preferably 0.0007 or less. When the dielectric loss tangent at 25° C. and a frequency of 2.45 GHz is too large, transmission loss when an electrical signal is transmitted to a high-frequency device tends to increase.

A thermal expansion coefficient in a temperature range from 30 to 380° C. is preferably from $20\times10^{-7}$ to $50\times10^{-7}/°$ C., from $22\times10^{-7}$ to $48\times10^{-7}/°$ C., from $23\times10^{-7}$ to $47\times10^{-7}/°$ C., from $25\times10^{-7}$ to $46\times10^{-7}/°$ C., from $28\times10^{-7}$ to $45\times10^{-7}/°$ C., from $30\times10^{-7}/°$ C., to $43\times10^{-7}/°$ C., or from $32\times10^{-7}$ to $41\times10^{-7}/°$ C., and particularly preferably from $35\times10^{-7}$ to $39\times10^{-7}/°$ C. When the thermal expansion coefficient in a temperature range from 30 to 380° C. is outside the range described above, a difference in thermal expansion with silicon, a material of semiconductor chips, is increased. As such, the stress on a connection portion when mounting a chip becomes larger, and connection reliability tends to be low.

A strain point is preferably 530° C. or higher, 540° C. or higher, 550° C. or higher, 560° C. or higher, 570° C. or higher, or 580° C. or higher, and particularly preferably 590° C. or higher. When the strain point is too low, the glass sheet tends to shrink due to heat in a heat treatment during the production of multi-layer circuit board, and thus a wiring defect tends to occur during the production of multi-layer circuit board.

A liquidus viscosity is preferably $10^{4.0}$ dPa·s or greater, $10^{4.2}$ dPa·s or greater, $10^{4.6}$ dPa·s or greater, $10^{4.8}$ dPa·s or greater, or $10^{5.0}$ dPa·s or greater, and particularly preferably $10^{5.2}$ dPa·s or greater. When the liquidus viscosity is too low, the glass tends to devitrify during forming.

The Young's modulus is preferably 40 GPa or greater, 41 GPa or greater, 43 GPa or greater, 45 GPa or greater, 47 GPa or greater, 50 GPa or greater, 51 GPa or greater, 52 GPa or greater, 53 GPa or greater, or 54 GPa or greater, and particularly preferably 55 GPa or greater. When the Young's modulus is too small, the glass sheet tends to bend, and thus a wiring defect tends to occur during the production of multi-layer circuit board.

A β-OH value is preferably 1.1 mm$^{-1}$ or less, 0.6 mm$^{-1}$ or less, 0.55 mm$^{-1}$ or less, 0.5 mm$^{-1}$ or less, 0.45 mm$^{-1}$ or less, 0.4 mm$^{-1}$ or less, 0.35 mm$^{-1}$ or less, 0.3 mm$^{-1}$ or less, 0.25 mm$^{-1}$ or less, 0.2 mm$^{-1}$ or less, or 0.15 mm$^{-1}$ or less, and particularly preferably 0.1 mm$^{-1}$ or less. When the β-OH value is too large, it becomes difficult to ensure a low dielectric property. Note that the "β-OH value" is a value calculated based on the following equation using FT-IR.

$$\beta\text{-OH value}=(1X)\log(T_1/T_2)$$

X: sheet thickness (mm)
$T_1$: transmittance (%) at a reference wavelength of 3846 cm$^{-1}$
$T_2$: minimum transmittance (%) at a hydroxyl group absorption wavelength of around 3600 cm$^{-1}$ The glass sheet according to an embodiment of the present invention preferably has a through hole formed in a sheet thickness direction. From the viewpoint of increasing density of circuits, an inner diameter of the through hole is preferably 200 μm or less, 180 μm or less, 150 μm or less, 130 μm or less, 120 μm or less, 100 μm or less, or 50 μm or less, and particularly preferably 30 μm or less. However, when an average inner diameter of the through hole is too small, it is difficult to form a circuit structure for establishing conduction between both surfaces of the glass sheet. As such, the inner diameter of the through hole is preferably 1 μm or greater, 3 μm or greater, 5 μm or greater, or 7 μm or greater, and particularly preferably 10 μm or greater.

Various methods can be employed to form a small through hole in a glass sheet. From the viewpoint of efficiently forming a small through hole, a preferred method is forming a modified portion in a glass sheet with a laser and then etching the modified portion to form a through hole. Another preferred method is forming a fine through hole in a glass sheet and then enlarging an opening area of the through hole by etching.

A difference between a maximum value and a minimum value of the inner diameter of the through hole is preferably 100 μm or less, 80 μm or less, 70 μm or less, 60 μm or less, 50 μm or less, 45 μm or less, 40 μm or less, 35 μm or less, or 30 μm or less, and particularly preferably 25 μm or less. When the difference between the maximum value and the minimum value of the inner diameter of the through hole is too large, the length of a circuit for establishing conduction between both surfaces of the glass sheet becomes unnecessarily long, and it becomes difficult to reduce transmission loss.

In the glass sheet according to an embodiment of the present invention, a sheet thickness is preferably 0.5 mm or less, from 1 to 100 μm, or from 5 to 50 μm, and particularly preferably from 10 to 30 μm. When the sheet thickness is too large, the distance between the ground and signal lines increases, and the effective relative dielectric constant increases. Furthermore, it becomes difficult to form a through hole in the glass sheet, making high density circuits in multi-layer circuit boards difficult. Note that when the sheet thickness is too small, handling of the glass sheet becomes difficult.

The glass sheet according to an embodiment of the present invention is preferably formed by an overflow downdraw method. In this way, an unpolished glass sheet without surface defects can be efficiently obtained. Various forming methods can be employed aside from the overflow downdraw method. For example, a forming method such as a slot-down method, a float method, or a roll-out method can be employed.

From the viewpoint of making fine circuits, an arithmetic mean roughness Ra of a surface of the glass sheet is preferably 10 nm or less, 5 nm or less, 2 nm or less, 1 nm or less, or 0.5 nm or less, and particularly preferably 0.2 nm or less. When the arithmetic mean roughness Ra of a surface of the glass sheet is too large, it becomes difficult to make fine circuits. In addition, an arithmetic mean roughness Ra of a circuit formed on a surface of the glass sheet increases. It causes excessive resistance loss due to the so-called skin effect, which occurs when a current is passed through a circuit of a high-frequency device. The strength of the glass sheet also reduces, making the glass sheet easy to break. Note that the "arithmetic mean roughness Ra" can be measured by a stylus-type surface roughness measuring instrument or an atomic force microscope (AFM).

The resin layer is preferably a pre-preg in which a glass cloth is impregnated with a resin. When the resin layer is a pre-preg in which a glass cloth is impregnated with a resin, elasticity, strength, heat resistance, low dielectric properties, and the like are easily adjusted depending on the glass composition and the type of weave of the glass cloth as well as the composition and the blending amount of the resin used in the impregnation. Furthermore, if the prepreg is stacked above and below a metal layer such as copper foil and then a heat and pressure treatment is performed on the prepreg that is further sandwiched between metal layers, the pre-preg can also serve as an adhesive because of the remelting of semi-cured resin in the pre-preg. Note that an epoxy resin is commonly used in a resin for impregnating a glass cloth.

In the laminate according to an embodiment of the present invention, the resin layer preferably has a relative dielectric constant at 25° C. and a frequency of 28 GHz of 5 or less. 4.9 or less, 4.8 or less, 4.7 or less, or 4.6 or less, and particularly preferably 4.5 or less. When the relative dielectric constant at 25° C. and a frequency of 28 GHz is too large, transmission loss when an electrical signal is transmitted to a high-frequency device tends to increase.

In the laminate according to an embodiment of the present invention, the resin layer preferably has a dielectric loss tangent at 25° C. and a frequency of 28 GHz of 0.01 or less, 0.009 or less, 0.008 or less, 0.007 or less, 0.006 or less, 0.005 or less, or 0.004 or less, and particularly preferably 0.003 or less. When the dielectric loss tangent at 25° C. and a frequency of 28 GHz is too large, transmission loss when an electrical signal is transmitted to a high-frequency device tends to increase.

In the laminate according to an embodiment of the present invention, the resin layer. preferably has a relative dielectric constant at 25° C. and a frequency of 2.45 GHz of 5 or less, 4.9 or less, 4.8 or less, 4.7 or less, or 4.6 or less, and particularly preferably 4.5 or less. When the relative dielectric constant at 25° C.' and a frequency of 2.45 GHz is too large, transmission loss when an electrical signal is transmitted to a high-frequency device tends to increase.

In the laminate according to an embodiment of the present invention, the resin layer preferably has a dielectric loss tangent at 25° C. and a frequency of 2.45 GHz of 0.01 or less, 0.009 or less, 0.008 or less, 0.007 or less, 0.006 or less, 0.005 or less, 0.004 or less, 0.003 or less, 0.002 or less, 0.001 or less, 0.0009 or less, or 0.0008 or less, and particularly preferably 0.0007 or less. When the dielectric loss tangent at 25° C. and a frequency of 2.45 GHz is too large, transmission loss when an electrical signal is transmitted to a high-frequency device tends to increase.

Example 1

The present invention will be described in detail below based on examples. Note that the following examples are merely illustrative. The present invention is not limited to the following examples in any way.

Tables 1 to 3 present the Examples (Samples No. 1 to 22 and 24 to 32) and Comparative Examples (Sample No. 23) of the present invention.

TABLE 1

|  |  | No. 1 | No. 2 | No. 3 | No. 4 | No. 5 | No. 6 |
| --- | --- | --- | --- | --- | --- | --- | --- |
| $SiO_2$ | mol % | 65.9 | 67.4 | 67.4 | 67.9 | 67.4 | 68.4 |
| $Al_2O_3$ | mol % | 4.0 | 5.0 | 5.0 | 5.0 | 5.0 | 5.0 |
| $B_2O_3$ | mol % | 26.0 | 23.5 | 24.0 | 24.0 | 24.0 | 23.5 |
| MgO | mol % | 1.0 | 1.0 | 1.0 | 0.5 | 0.5 | 0.5 |
| CaO | mol % | 3.0 | 3.0 | 2.5 | 2.5 | 3.0 | 2.5 |
| SrO | mol % | 0.0 | 0.0 | 0.0 | 0.0 | 0.0 | 0.0 |
| BaO | mol % | 0.0 | 0.0 | 0.0 | 0.0 | 0.0 | 0.0 |
| $Na_2O$ | mol % | 0.01 | 0.01 | 0.01 | 0.01 | 0.01 | 0.01 |
| $K_2O$ | mol % | 0.01 | 0.01 | 0.01 | 0.01 | 0.01 | 0.01 |
| $SnO_2$ | mol % | 0.1 | 0.1 | 0.1 | 0.1 | 0.1 | 0.1 |
| $Fe_2O_3$ | mol % | — | — | — | — | — | — |
| MgO + CaO + SrO + BaO | mol % | 4.0 | 4.0 | 3.5 | 3.0 | 3.5 | 3.0 |
| $Na_2O + K_2O$ | mol % | 0.02 | 0.02 | 0.02 | 0.02 | 0.02 | 0.02 |
| Dielectric Constant (2.45 GHz) | — | 3.99 | Not measured | Not measured | Not measured | Not measured | Not measured |
| Dielectric Loss Tangent (2.45 GHz) | — | 0.0007 | Not measured | Not measured | Not measured | Not measured | Not measured |
| Dielectric Constant (28 GHz) | — | 4.02 | Not measured | Not measured | Not measured | Not measured | Not measured |
| Dielectric Loss Tangent (28 GHz) | — | 0.0016 | Not measured | Not measured | Not measured | Not measured | Not measured |
| Density | g/cm$^3$ | 2.155 | Not measured | Not measured | Not measured | Not measured | Not measured |
| Thermal Expansion Coefficient (from 30 to 380° C.) | ppm/° C. | 3.3 | Not measured | Not measured | Not measured | Not measured | Not measured |
| Strain Point | ° C. | 514 | Not measured | Not measured | Not measured | Not measured | Not measured |
| Annealing Point | ° C. | 576 | Not measured | Not measured | Not measured | Not measured | Not measured |
| Softening Point | ° C. | Not measured | Not measured | Not measured | Not measured | Not measured | Not measured |
| T at $10^{4.0}$ dPa · s | ° C. | 1316 | Not measured | Not measured | Not measured | Not measured | Not measured |
| T at $10^{3.0}$ dPa · s | ° C. | 1522 | Not measured | Not measured | Not measured | Not measured | Not measured |
| T at $10^{2.5}$ dPa · s | ° C. | 1645 | Not measured | Not measured | Not measured | Not measured | Not measured |
| Liquidus temperature | ° C. | 1002 | Not measured | Not measured | Not measured | Not measured | Not measured |
| Liquidus Viscosity (log η at TL) | — | 6.5 | Not measured | Not measured | Not measured | Not measured | Not measured |
| Young's Modulus | GPa | 48.2 | Not measured | Not measured | Not measured | Not measured | Not measured |
| Modulus of Rigidity | GPa | 19.5 | Not measured | Not measured | Not measured | Not measured | Not measured |
| Poisson's Ratio | — | 0.24 | Not measured | Not measured | Not measured | Not measured | Not measured |
| β-OH | mm$^{-1}$ | 0.423 | Not measured | Not measured | Not measured | Not measured | Not measured |

TABLE 1-continued

|  |  | No. 7 | No. 8 | No. 9 | No. 10 | No. 11 | No. 12 |
|---|---|---|---|---|---|---|---|
| $SiO_2$ | mol % | 68.4 | 65.9 | 69.9 | 73.9 | 65.9 | 69.9 |
| $Al_2O_3$ | mol % | 4.5 | 4.0 | 4.0 | 4.0 | 4.0 | 4.0 |
| $B_2O_3$ | mol % | 24.0 | 24.0 | 20.0 | 16.0 | 24.0 | 20.0 |
| MgO | mol % | 0.5 | 3.0 | 3.0 | 3.0 | 1.0 | 1.0 |
| CaO | mol % | 2.5 | 3.0 | 3.0 | 3.0 | 5.0 | 5.0 |
| SrO | mol % | 0.0 | 0.0 | 0.0 | 0.0 | 0.0 | 0.0 |
| BaO | mol % | 0.0 | 0.0 | 0.0 | 0.0 | 0.0 | 0.0 |
| $Na_2O$ | mol % | 0.01 | 0.01 | 0.01 | 0.01 | 0.01 | 0.01 |
| $K_2O$ | mol % | 0.01 | 0.01 | 0.01 | 0.01 | 0.01 | 0.01 |
| $SnO_2$ | mol % | 0.1 | 0.1 | 0.1 | 0.1 | 0.1 | 0.1 |
| $Fe_2O_3$ | mol % | — | — | — | — | — | — |
| MgO + CaO + SrO + BaO | mol % | 3.0 | 6.0 | 6.0 | 6.0 | 6.0 | 6.0 |
| $Na_2O + K_2O$ | mol % | 0.02 | 0.02 | 0.02 | 0.02 | 0.02 | 0.02 |
| Dielectric Constant (2.45 GHz) | — | Not measured | 4.1 | 4.1 | 4.1 | 4.2 | 4.2 |
| Dielectric Loss Tangent (2.45 GHz) | — | Not measured | 0.0009 | 0.0010 | 0.0011 | 0.0010 | 0.0011 |
| Dielectric Constant (28 GHz) | — | Not measured | Not measured | Not measured | Not measured | Not measured | Not measured |
| Dielectric Loss Tangent (28 GHz) | — | Not measured | Not measured | Not measured | Not measured | Not measured | Not measured |
| Density | g/cm³ | Not measured | 2.184 | 2.197 | 2.213 | 2.196 | 2.208 |
| Thermal Expansion Coefficient (from 30 to 380° C.) | ppm/° C. | Not measured | 3.2 | 2.9 | 2.6 | 3.2 | 3.0 |
| Strain Point | ° C. | Not measured | 551 | 570 | 611 | 551 | 576 |
| Annealing Point | ° C. | Not measured | 611 | 644 | 696 | 613 | 646 |
| Softening Point | ° C. | Not measured | Not measured | Not measured | Not measured | Not measured | Not measured |
| T at $10^{4.0}$ dPa · s | ° C. | Not measured | 1303 | 1356 | 1421 | 1288 | 1346 |
| T at $10^{3.0}$ dPa · s | ° C. | Not measured | 1499 | 1556 | 1622 | 1487 | 1548 |
| T at $10^{2.5}$ dPa · s | ° C. | Not measured | 1620 | 1680 | 1756 | 1611 | 1672 |
| Liquidus temperature | ° C. | Not measured | 1060 | 1068 | 1074 | 1017 | 1053 |
| Liquidus Viscosity (log η at TL) | — | Not measured | 5.9 | 6.5 | 7.2 | 6.3 | 6.5 |
| Young's Modulus | GPa | Not measured | 51 | 54 | 57 | 52 | 55 |
| Modulus of Rigidity | GPa | Not measured | 21 | 22 | 24 | 21 | 23 |
| Poisson's Ratio | — | Not measured | 0.2 | 0.2 | 0.2 | 0.2 | 0.2 |
| β-OH | $mm^{-1}$ | Not measured | Not measured | 0.5 | 0.4 | Not measured | 0.5 |

TABLE 2

|  |  | No. 13 | No. 14 | No. 15 | No. 16 | No. 17 | No. 18 |
|---|---|---|---|---|---|---|---|
| $SiO_2$ | mol % | 65.9 | 69.9 | 73.9 | 65.9 | 67.9 | 64.9 |
| $Al_2O_3$ | mol % | 4.0 | 4.0 | 4.0 | 3.0 | 3.0 | 5.0 |
| $B_2O_3$ | mol % | 24.0 | 20.0 | 16.0 | 27.0 | 25.0 | 24.0 |
| MgO | mol % | 5.0 | 5.0 | 5.0 | 1.0 | 1.0 | 1.0 |
| CaO | mol % | 1.0 | 1.0 | 1.0 | 3.0 | 3.0 | 5.0 |
| SrO | mol % | 0.0 | 0.0 | 0.0 | 0.0 | 0.0 | 0.0 |
| BaO | mol % | 0.0 | 0.0 | 0.0 | 0.0 | 0.0 | 0.0 |
| $Na_2O$ | mol % | 0.01 | 0.01 | 0.01 | 0.01 | 0.01 | 0.01 |
| $K_2O$ | mol % | 0.01 | 0.01 | 0.01 | 0.01 | 0.01 | 0.01 |
| $SnO_2$ | mol % | 0.1 | 0.1 | 0.1 | 0.1 | 0.1 | 0.1 |
| $Fe_2O_3$ | mol % | — | — | — | — | — | — |
| MgO + CaO + SrO + BaO | mol % | 6.0 | 6.0 | 6.0 | 4.0 | 4.0 | 6.0 |
| $Na_2O + K_2O$ | mol % | 0.02 | 0.02 | 0.02 | 0.02 | 0.02 | 0.02 |
| Dielectric Constant (2.45 GHz) | — | 4.04 | 4.05 | 4.09 | 3.94 | 3.96 | 4.2 |
| Dielectric Loss Tangent (2.45 GHz) | — | 0.0010 | 0.0010 | 0.0010 | 0.0007 | 0.0007 | 0.0010 |
| Dielectric Constant (28 GHz) | — | Not measured | Not measured | Not measured | Not measured | Not measured | Not measured |
| Dielectric Loss Tangent (28 GHz) | — | Not measured | Not measured | Not measured | Not measured | Not measured | Not measured |
| Density | g/cm3 | 2.1769 | 2.1888 | Not measured | 2.1398 | 2.1494 | 2.1991 |

TABLE 2-continued

| | | | | | | | |
|---|---|---|---|---|---|---|---|
| Thermal Expansion Coefficient (from 30 to 380° C.) | ppm/° C. | 3.1 | 2.795 | 2.514 | 3.355 | 3.184 | 3.287 |
| Strain Point | ° C. | 560 | 572 | 604 | 505 | 510 | 550 |
| Annealing Point | ° C. | 618 | 648 | 695 | 564 | 574 | 609 |
| Softening Point | ° C. | Not measured | Not measured | Not measured | Not measured | Not measured | Not measured |
| T at $10^{4.0}$ dPa·s | ° C. | 1309 | 1373 | 1430.3 | 1314 | 1344 | 1277 |
| T at $10^{3.0}$ dPa·s | ° C. | 1498 | 1572 | 1625.5 | 1519 | 1552 | 1469 |
| T at $10^{2.5}$ dPa·s | ° C. | 1616 | 1695 | 1736.9 | 1645 | 1690 | 1588 |
| Liquidus temperature | ° C. | 1140 | 1145.3 | 1139.9 | 975.32 | 980.9 | 939.34 |
| Liquidus Viscosity (log η at TL) | — | 5.26 | 5.84 | 6.57 | 6.58 | 6.79 | 7.07 |
| Young's Modulus | GPa | 50.759 | 53.794 | Not measured | 45.883 | 47.104 | 51.869 |
| Modulus of Rigidity | GPa | 20.899 | 22.231 | Not measured | 18.79 | 19.327 | 21.276 |
| Poisson's Patio | — | 0.214 | 0.2095 | Not measured | 0.221 | 0.2185 | 0.219 |
| β-OH | $mm^{-1}$ | Not measured | 0.43 | Not measured | Not measured | 0.7 | Not measured |

| | | No. 19 | No. 20 | No. 21 | No. 22 | No. 23 |
|---|---|---|---|---|---|---|
| $SiO_2$ | mol % | 65.9 | 65.9 | 65.9 | 64.2 | 66.3 |
| $Al_2O_3$ | mol % | 3.0 | 4.0 | 3.0 | 6.3 | 10.8 |
| $B_2O_3$ | mol % | 27.0 | 26.0 | 27.0 | 23.2 | 9.9 |
| MgO | mol % | 3.0 | 3.0 | 2.0 | 1.6 | 0.5 |
| CaO | mol % | 1.0 | 1.0 | 2.0 | 4.6 | 9.5 |
| SrO | mol % | 0.0 | 0.0 | 0.0 | 0.0 | 2.9 |
| BaO | mol % | 0.0 | 0.0 | 0.0 | 0.0 | 0.2 |
| $Na_2O$ | mol % | 0.01 | 0.01 | 0.01 | 0.01 | 0.01 |
| $K_2O$ | mol % | 0.01 | 0.01 | 0.01 | 0.01 | 0.01 |
| $SnO_2$ | mol % | 0.1 | 0.1 | 0.1 | 0.1 | 0.1 |
| $Fe_2O_3$ | mol % | — | — | — | — | — |
| MgO + CaO + SrO + BaO | mol % | 4.0 | 4.0 | 4.0 | 6.2 | 13.1 |
| $Na_2O + K_2O$ | mol % | 0.02 | 0.02 | 0.02 | 0.02 | 0.02 |
| Dielectric Constant (2.45 GHz) | — | 3.9 | 4.0 | 3.9 | 4.3 | 5.3 |
| Dielectric Loss Tangent (2.45 GHz) | — | 0.0007 | 0.0007 | 0.0007 | 0.0012 | 0.0031 |
| Dielectric Constant (28 GHz) | — | Not measured | Not measured | Not measured | 4.3 | 5.36 |
| Dielectric Loss Tangent (28 GHz) | — | Not measured | Not measured | Not measured | 0.0030 | 0.0058 |
| Density | g/cm3 | 2.1357 | 2.151 | 2.140 | 2.218 | 2.459 |
| Thermal Expansion Coefficient (from 30 to 380° C.) | ppm/° C. | 3.287 | 3.2 | 3.3 | 3.2 | 3.9 |
| Strain Point | ° C. | 522 | 5.32 | 514 | 569 | 654 |
| Annealing Point | ° C. | 579 | 590 | 572 | 626 | 709 |
| Softening Point | ° C. | Not measured | Not measured | Not measured | 907 | 944 |
| T at $10^{4.0}$ dPa·s | ° C. | 1332 | 1315 | 1333 | 1272 | 1268 |
| T at $10^{3.0}$ dPa·s | ° C. | 1537 | 1511 | 1541 | 1455 | 1428 |
| T at $10^{2.5}$ dPa·s | ° C. | 1667 | 1634 | 1678 | 1568 | 1532 |
| Liquidus temperature | ° C. | 1119.3 | 1143 | 1028 | 1069 | 1084 |
| Liquidus Viscosity (log η at TL) | — | 5.43 | 5.2 | 6.2 | 5.7 | 5.7 |
| Young's Modulus | GPa | 45.687 | 47 | 46 | 54 | 73 |
| Modulus of Rigidity | GPa | 18.709 | 19 | 19 | 22 | 30 |
| Poisson's Patio | — | 0.221 | 0.2 | 0.2 | 0.2 | 0.2 |
| β-OH | $mm^{-1}$ | 0.7 | 0.6 | 0.7 | Not measured | 0.5 |

TABLE 3

| | | No. 24 | No. 25 | No. 26 | No. 27 | No. 28 |
|---|---|---|---|---|---|---|
| $SiO_2$ | mol % | 66.2 | 65.9 | 65.7 | 66.1 | 66.1 |
| $Al_2O_3$ | mol % | 4.2 | 4.2 | 4.2 | 4.2 | 4.2 |
| $B_2O_3$ | mol % | 25.5 | 25.8 | 26.0 | 25.7 | 25.6 |
| MgO | mol % | 1.0 | 1.0 | 1.0 | 1.0 | 1.0 |
| CaO | mol % | 2.9 | 2.9 | 2.9 | 3.0 | 3.0 |
| SrO | mol % | 0.0 | 0.0 | 0.0 | 0.0 | 0.0 |
| BaO | mol % | 0.0 | 0.0 | 0.0 | 0.0 | 0.0 |
| $Na_2O$ | mol % | 0.028 | 0.025 | 0.028 | 0.012 | 0.011 |
| $K_2O$ | mol % | 0.009 | 0.008 | 0.009 | 0.008 | 0.008 |
| $SnO_2$ | mol % | 0.07 | 0.08 | 0.08 | 0.09 | 0.09 |
| $Fe_2O_3$ | mol % | 0.014 | 0.014 | 0.014 | 0.015 | 0.015 |
| MgO + CaO + SrO + BaO | mol % | 3.9 | 3.9 | 3.9 | 4.0 | 4.0 |
| $Na_2O + K_2O$ | mol % | 0.037 | 0.033 | 0.037 | 0.0206 | 0.0195 |

TABLE 3-continued

| | | | | | | |
|---|---|---|---|---|---|---|
| Dielectric Constant (2.45 GHz) | — | Not measured | Not measured | Not measured | Not measured | Not measured |
| Dielectric Loss Tangent (2.45 GHz) | — | Not measured | Not measured | Not measured | Not measured | Not measured |
| Dielectric Constant (28 GHz) | — | 4.0 | 4.0 | 4.0 | 4.0 | 3.9 |
| Dielectric Loss Tangent (28 GHz) | — | 0.0016 | 0.0016 | 0.0016 | 0.0015 | 0.0160 |
| Density | g/cm$^3$ | 2.160 | 2.159 | 2.159 | 2.160 | 2.160 |
| Thermal Expansion Coefficient (from 30 to 380° C.) | ppm/° C. | Not measured | Not measured | Not measured | Not measured | Not measured |
| Strain Point | ° C. | Not measured | Not measured | Not measured | Not measured | Not measured |
| Annealing Point | ° C. | Not measured | Not measured | Not measured | Not measured | Not measured |
| Softening Point | ° C. | Not measured | Not measured | Not measured | Not measured | Not measured |
| T at $10^{4.0}$ dPa · s | ° C. | Not measured | Not measured | Not measured | Not measured | Not measured |
| T at $10^{3.0}$ dPa · s | ° C. | Not measured | Not measured | Not measured | Not measured | Not measured |
| T at $10^{2.5}$ dPa · s | ° C. | Not measured | Not measured | Not measured | Not measured | Not measured |
| Liquidus temperature | ° C. | Not measured | Not measured | Not measured | Not measured | Not measured |
| Liquidus Viscosity (log η at TL) | — | Not measured | Not measured | Not measured | Not measured | Not measured |
| Young's Modulus | GPa | Not measured | Not measured | Not measured | Not measured | Not measured |
| Modulus of Rigidity | GPa | Not measured | Not measured | Not measured | Not measured | Not measured |
| Poisson's Patio | — | Not measured | Not measured | Not measured | Not measured | Not measured |
| β-OH | mm$^{-1}$ | 0.5 | 0.5 | 0.5 | 0.5 | 0.5 |

| | | | No. 29 | No. 30 | No. 31 | No. 32 |
|---|---|---|---|---|---|---|
| | SiO$_2$ | mol % | 66.2 | 66.1 | 66.0 | 66.0 |
| | Al$_2$O$_3$ | mol % | 4.2 | 4.1 | 4.1 | 4.1 |
| | B$_2$O$_3$ | mol % | 25.5 | 25.8 | 25.8 | 25.8 |
| | MgO | mol % | 1.0 | 1.0 | 1.0 | 1.0 |
| | CaO | mol % | 3.0 | 3.0 | 3.0 | 2.9 |
| | SrO | mol % | 0.0 | 0.0 | 0.0 | 0.0 |
| | BaO | mol % | 0.0 | 0.0 | 0.0 | 0.0 |
| | Na$_2$O | mol % | 0.010 | 0.009 | 0.009 | 0.009 |
| | K$_2$O | mol % | 0.007 | 0.008 | 0.007 | 0.008 |
| | SnO$_2$ | mol % | 0.09 | 0.09 | 0.09 | 0.09 |
| | Fe$_2$O$_3$ | mol % | 0.015 | 0.015 | 0.015 | 0.015 |
| | MgO + CaO + SrO + BaO | mol % | 3.9 | 3.9 | 3.9 | 3.9 |
| | Na$_2$O + K$_2$O | mol % | 0.0178 | 0.0175 | 0.0168 | 0.0174 |
| Dielectric Constant (2.45 GHz) | | — | Not measured | Not measured | Not measured | Not measured |
| Dielectric Loss Tangent (2.45 GHz) | | — | Not measured | Not measured | Not measured | Not measured |
| Dielectric Constant (28 GHz) | | — | 4.0 | 4.0 | 4.0 | 4.0 |
| Dielectric Loss Tangent (28 GHz) | | — | 0.0160 | 0.0016 | 0.0016 | 0.0016 |
| Density | | g/cm$^3$ | 2.160 | 2.159 | 2.158 | 2.158 |
| Thermal Expansion Coefficient (from 30 to 380° C.) | | ppm/° C. | Not measured | Not measured | Not measured | Not measured |
| Strain Point | | ° C. | Not measured | Not measured | Not measured | Not measured |
| Annealing Point | | ° C. | Not measured | Not measured | Not measured | Not measured |
| Softening Point | | ° C. | Not measured | Not measured | Not measured | Not measured |
| T at $10^{4.0}$ dPa · s | | ° C. | Not measured | Not measured | Not measured | Not measured |
| T at $10^{3.0}$ dPa · s | | ° C. | Not measured | Not measured | Not measured | Not measured |
| T at $10^{2.5}$ dPa · s | | ° C. | Not measured | Not measured | Not measured | Not measured |
| Liquidus temperature | | ° C. | Not measured | Not measured | Not measured | Not measured |
| Liquidus Viscosity (log η at TL) | | — | Not measured | Not measured | Not measured | Not measured |
| Young's Modulus | | GPa | Not measured | Not measured | Not measured | Not measured |
| Modulus of Rigidity | | GPa | Not measured | Not measured | Not measured | Not measured |

TABLE 3-continued

| | | | | | | |
|---|---|---|---|---|---|---|
| Poisson's Patio | | — | Not measured | Not measured | Not measured | Not measured |
| β-OH | | mm$^{-1}$ | 0.5 | 0.5 | 0.5 | 0.5 |

Samples No. 1 to 32 were prepared as follows. First, glass raw materials were mixed to give a glass composition presented in the table, and the mixture was placed into a platinum crucible. After being melted at 1600° C. for 24 hours, the mixture was poured onto a carbon plate and formed into a flat plate shape. Next, for each of the resulting samples, the relative dielectric constant at 25° C. and a frequency of 2.45 GHz, the dielectric loss tangent at 25° C. and a frequency of 2.45 GHz, the relative dielectric constant at 25° C. and a frequency of 28 GHz, the dielectric loss tangent at 25° C. and a frequency of 28 GHz, the density, the thermal expansion coefficient, the strain point, the annealing point, the softening point, the temperature at $10^{4.0}$ dPa·s, the temperature at $10^{3.0}$ dPa·s, the temperature at $10^{2.5}$ dPa·s, the liquidus temperature, the liquidus viscosity, the Young's modulus, the modulus of rigidity, the Poisson's ratio, and the OH value were evaluated.

The relative dielectric constant and the dielectric loss tangent at 25° C. and a frequency of 2.45 GHz as well as the relative dielectric constant and the dielectric loss tangent at 25° C. and a frequency of 28 GHz refer to values measured by a well-known cavity resonator method.

The density is a value measured by the well-known Archimedes method.

The thermal expansion coefficient is a value measured by a dilatometer, and is an average value in a temperature range from 30 to 380° C.

The strain point, the annealing point, and the softening point are values measured based on methods of ASTM C336 and C338.

The temperature at $10^{4.0}$ dPa·s, the temperature at $10^{3.0}$ dPa·s, and the temperature at $10^{2.5}$ dPa·s are values measured by a platinum sphere pull up method.

The liquidus temperature is a value obtained by measuring a temperature at which crystals are precipitated after glass powder that passed through a standard 30-mesh sieve (500 μm) and remained on a 50-mesh sieve (300 μm) is placed in a platinum boat and then kept for 24 hours in a gradient heating furnace.

The liquidus viscosity is a value obtained by measuring the viscosity of glass at the liquidus temperature using a platinum sphere pull up method.

The Young's modulus and the modulus of rigidity are values measured by a resonance method. The Poisson's ratio is a value calculated based on the Young's modulus and the modulus of rigidity.

The β-OH value is a value measured by the method described above.

As can be seen from the table, Samples No. 1 to 22 and 24 to 32 had low dielectric properties and are suitable for a high-frequency device. Meanwhile, No. 23 did not have low dielectric properties and was unsuitable for a high-frequency device.

Example 2

Glass batches having the glass compositions of Samples No. 1 to 22 and 24 to 32 listed in Tables 1 to 3 were melted in a test melting furnace, resulting in molten glasses. Then, the molten glasses were subjected to forming by an overflow downdraw method and cut, forming glass sheets having a sheet thickness of 50 μm. Note that during forming of the glass sheets, the surface roughness and the like of the glass sheets were adjusted by appropriately adjusting the speed of a drawing roller, the speed of a cooling roller, the temperature distribution in a heating apparatus, the temperature of molten glass, the flow rate of molten glass, a glass sheet-drawing speed, the revolution speed of a stirrer, and the like. The arithmetic mean roughness Ra of a surface of the glass sheets obtained was measured by an atomic force microscope (AFM), and the result was 0.2 nm. Next, a plurality of through holes were formed in the glass sheets. The through holes were made by irradiating a surface of the glass sheets with a commercially available picosecond laser to form a modified portion, and then removing the modified portion by etching. The inner diameters of the through holes according to Sample No. 7 and Sample No. 14 described in the table were measured separately. In both Sample No. 7 and Sample No. 14, the maximum value of the inner diameters of the through holes was 85 μm, the minimum value of the inner diameters of the through holes was 62 μm, and the difference between the maximum value and the minimum value of the inner diameters of the through holes was 23 μm.

Next, a conductor circuit layer was formed by a semi-additive process on the inner circumferential surfaces of the through holes of the glass sheets according to Samples No. 1 to 22 and 24 to 32 described in Tables 1 to 3. Specifically, the conductor circuit layer was formed by, in this order, forming a seed metal layer by sputtering, forming a metal layer by electroless plating, forming a resist pattern, and forming copper plating for circuits.

Then, a pre-preg, in which a glass cloth is impregnated with an epoxy resin, was disposed via an adhesive layer on both surfaces of each of the glass sheets according to Samples No. 1 to 22 and 24 to 32. The resulting structure was laminated into one piece by thermocompression bonding, resulting in a laminate having a three-layer structure of a resin layer, a glass sheet, and a resin layer. Note that, in the pre-pregs, wiring made from a copper metal layer were formed on the inner circumferential surfaces of a plurality of through holes. In addition, after connecting the inner layer and the outer layer by plating the inner circumferential surfaces of the through holes and the surfaces of the resin layers, a surface pattern was formed on an outermost layer. Next, a through hole was mechanically made in a thickness direction of the laminate, wiring made from a copper metal layer was formed on the inner circumferential surface of the through hole, and a surface was plated to connect the inner layer and the outer layer. Then, a solder resist layer was formed on an outermost layer. Finally, an external connection terminal portion was exposed by photolithography, plated, and then a solder ball was formed, resulting in a multi-layer circuit board containing each of the samples.

INDUSTRIAL APPLICABILITY

The laminate according to an embodiment of the present invention is suitable for multi-layer circuit boards for high frequencies, and is also suitable as a high-frequency filter (diplexer) or a high-density semiconductor package board requiring low dielectric properties.

The invention claimed is:

1. A laminate, comprising
at least one glass sheet and at least one resin layer,
a relative dielectric constant of the glass sheet at 25° C. and a frequency of 2.45 GHz being 5 or less, and a dielectric loss tangent of the glass sheet at 25° C. and a frequency of 2.45 GHz being 0.003 or less,
wherein the glass sheet comprises at least 60 mol % of $SiO_2$, from 1 to 15 mol % of $Al_2O_3$, from 20 to 30 mol % of $B_2O_3$, from 0 to 6.2 mol % of MgO+CaO+SrO+BaO, from 0 to 5 mol % of MgO, and from 0 to 5 mol % of CaO in a glass composition.

2. The laminate according to claim 1, wherein the resin layer is a pre-preg in which a glass cloth is impregnated with a resin.

3. The laminate according to claim 1, wherein a metal layer is formed on a surface of the glass sheet and/or inside the glass sheet.

4. The laminate according to claim 3, wherein the metal layer comprises one or more of copper, silver, gold, aluminum, molybdenum, tungsten, nickel, tin, and an alloy of these metals.

5. The laminate according to claim 1, wherein the glass sheet has a thickness from 5 to 50 μm.

6. The laminate according to claim 1, wherein a through hole is formed in the glass sheet in a thickness direction.

7. The laminate according to claim 6, wherein the through hole formed in the glass sheet has an inner diameter of 200 μm or less.

8. The laminate according to claim 6, wherein a difference between a maximum value and a minimum value of the inner diameter of the through hole formed in the glass sheet is 100 μm or less.

9. The laminate according to claim 6, wherein a metal layer is formed on an inner circumferential surface of the through hole formed in the glass sheet.

10. The laminate according to claim 1, wherein the laminate is used in a multi-layer circuit board.

* * * * *